United States Patent [19]

Sepponen

[11] Patent Number: 5,498,962
[45] Date of Patent: Mar. 12, 1996

[54] IMAGING METHOD

[75] Inventor: Raimo E. Sepponen, Helsinki, Finland

[73] Assignee: Picker Nordstar Inc., Helsinki, Finland

[21] Appl. No.: 209,427

[22] Filed: Mar. 10, 1994

[30] Foreign Application Priority Data

Mar. 10, 1993 [FI] Finland ................................. 931051

[51] Int. Cl.⁶ .................................................. G01V 3/14
[52] U.S. Cl. ............................................ 324/309; 324/307
[58] Field of Search ................................... 324/300, 307, 324/309, 314, 316; 128/653

[56] References Cited

U.S. PATENT DOCUMENTS

| | | | |
|---|---|---|---|
| 4,070,611 | 1/1978 | Ernst | 324/0.5 A |
| 4,615,829 | 10/1986 | Runge | 128/653 X |
| 4,668,904 | 5/1987 | Kupiainen | 323/350 |
| 4,699,148 | 10/1987 | Gyngell | 128/653 |
| 4,707,658 | 11/1987 | Frahm | 324/309 |
| 4,799,015 | 7/1987 | Sepponen | 324/314 |
| 5,159,270 | 10/1992 | Sepponen | 324/309 |
| 5,281,917 | 1/1994 | Santyr | 324/309 |
| 5,348,012 | 9/1994 | Kojima | 324/306 X |
| 5,391,989 | 2/1995 | Takane | 324/306 |

*Primary Examiner*—Louis M. Arana
*Assistant Examiner*—Mark Haynes
*Attorney, Agent, or Firm*—T. B. Gurin; J. J. Fry

[57] ABSTRACT

An SLP pulse is applied to an object to be imaged preceding one or more excitation pulses ($a°$ or $a$) of a known magnetic resonance imaging technique. The SLP pulse tilts the nuclear magnetization away from the direction of $B_o$, locks the magnetization with the rotating magnetic component and returns the magnetization back to the direction of $B_o$. The known magnetic resonance imaging technique used with the SLP pulse includes applying at least one excitation pulse to generate transverse magnetization in the object. The excitation pulse causes the angle between the nuclear magnetization and $B_o$ to be less than 90°.

14 Claims, 2 Drawing Sheets

IMAGING METHOD

BACKGROUND OF THE INVENTION

The present Invention relates to an imaging method based on nuclear magnetic resonance for the examination of an object, such as a human or animal body or industrial process.

Magnetic resonance Imaging (MRI) utilizes the nuclear magnetic resonance phenomenon (NMR) to determine the local distributions of the nuclear density and nucleus related NMR properties of an object or the physical and chemical characteristics having an effect thereon. Such NMR properties include longitudinal relaxation time (T1), transverse relaxation time (T2), relaxation time In a rotating frame (T1 rho), chemical shift, and coupling factors between nuclei. NMR properties are effected by physical phenomena such as flow rate, diffusion, paramagnetic materials, ferromagnetic materials, viscosity and temperature.

Methods and applications of magnetic resonance and magnetic resonance imaging have been described In the following references: "Biomedical Magnetic Resonance Imaging", by Wehrli, Shaw, and Kneeland, VCH Publishers Inc.. New York 1988; "Magnetic Resonance Imaging", by Stark and Bradley, C.V. Mosby Company, St Louis 1991; "The principles of nuclear magnetism", by Abragam, Clarendon press, Oxford 1961; "Pulse and Fourier Transform NMR", by Farrar and Becker, Academic Press, New York 1971; and U.S. Pat. No. 4,070,611 to Ernst. Additional references are mentioned In U.S. Pat. No. 5,159,270 to Sepponen.

In U.S. Pat. No. 4,668,904, to Kupiainen, there are described fast, controllable current sources which are needed in MRI experiments.

Imaging sequences having a small excitation angle and the spin echo formed by means of gradient operations are described in U.S. Pat. No. 4,707,658 to Frahm, Haase, Matthaei, Haenicke and Merboldt; U.S. Pat. No. 4,699,148 to Gygnel; "Koelaitteisto NMR-kuvausta varten" (Experimental apparatus for NMR-imaging by Tanttu, Master of Science thesis, Helsinki Technical University, Department of Technical Physics, 1982, page 69; and "Koelaitteisto liikkuvan kohteen NMR-kuvausta varten" (Experimental apparatus for NMR-imaging of a moving object), by Pohjonen, Licenciate thesis, Helsinki Technical University, Department of Technical Physics, 1984, pp. 39–40.

The contrast in images formed by these imaging sequences is discussed in "Signal intensity in fast NMR imaging with short repetition times", by Buxton, Fisel, Chien and Brady, J. Magn. Reson. vol. 83, pp. 576–585, 1989. The utilization of magnetization transfer phenomenon in MRI for generation of tissue contrast is also described in the U.S. Pat. No. 5,159,270.

The utilization of relaxation under the locking conditions in MRI has been described in U.S. Pat. No. 4,799,015 to Sepponen,.

In a selection of the imaging sequence for MR imaging one tends to maximize tissue contrast and resolution with as good signal-to-noise ratio as possible and with as short imaging time as possible. These requirements are in many respect contradictory. Tissue contrast is generated by suppressing signals emitted by tissues by an exploitation of relaxation processes. In the sequences used today in MRI, relaxation affects every tissues during the scanning process. The differences in relaxation in tissues may be enhanced by using contrast agents, such as Gd-DTPA compound, manufactured by Schering AG of Germany, and sold under the trademark Magnevist, or by using a magnetization transfer-phenomenon. Magnetization transfer-phenomenon has been described in U.S. Pat. No. 5,159,270 and "Magnetic Resonance Imaging", by Stark and Bradley, C. V. Mosby Company, St Louis, pp. 204–218, 1991. In addition the use of magnetization transfer in MRI has been reviewed in "Magnetization transfer contrast in magnetic resonance imaging", by Balaban and Ceckler, Magnetic Resonance Quarterly, Vol. 8, no. 2, pp. 116–137, 1992.

The contrast provided by known methods is limited by the strength of the polarizing magnetic field $B_o$. To maximize the signal-to-noise ratio and scanning speed a relatively high strength polarizing magnetic field is generally utilized. Magnetization transfer (MT) and relaxation time based contrast, however, are better at low strengths of the polarizing magnetic field. Because of this, low strengths of the polarizing magnetic field should be used. By using known methods it is difficult if not impossible to get a high signal-to-noise ratio, a good contrast and short scanning time simultaneously. In practice one is forced to make compromises, which decrease the diagnostic value of the study.

The present invention describes a method which is capable of eliminating the drawbacks of the prior art and provide a high tissue contrast and a high signal-to-noise ratio within a short scanning time.

SUMMARY OF THE INVENTION

In one aspect of the Invention a method for the magnetic resonance examination of an object using one of the known resonance imaging techniques is provided. In the method, a radio frequency pulse is applied to the object to tilt the nuclear magnetization from the direction of the polarizing magnetic field. The nuclear magnetization is allowed to relax along the magnetic component of the radio frequency pulse for a locking period. The nuclear magnetization Is oriented parallel to the polarizing magnetic field. A magnetic resonance imaging sequence is applied to the object. The sequence comprises applying at least one excitation pulse to the object to generate transverse magnetization In the object such that after each of said at least one excitation pulse the angle between the nuclear magnetization and the polarizing magnetic files Is less than 90°.

In a another aspect of the Invention, a spin-echo Is generated by performing the further steps of applying a first gradient for a first period and applying a second gradient having a component that is opposite the first gradient.

In still another aspect of the Invention a refocusing pulse Is applied after each of said at least one excitation pulse to generate one or more spin echoes.

In yet another aspect of the Invention the beginning of the radio frequency pulse oscillates at a frequency different from the resonance frequency and oscillates at a frequency approaching the resonance frequency in time.

In yet another aspect of the invention at least two excitation pulses follow the locking period. The excitation pulses generate a transverse magnetization wherein the angle between the nuclear magnetization and the polarizing magnetic field is less than 90°.

In another aspect of the invention the at least one excitation pulse is spatially selective and the width of the area to be excited is predetermined such that a moving material fills said area during TR.

In another aspect of the invention two or more images of the object are generated with one of different locking periods and different strengths of radio frequency pulse and information about the relaxation is derived from the acquired images.

In another aspect of the invention a contrast agent or paramagnetic substance is introduced into the object. The paramagnetic substance is introduced into the object between the acquisition of two images of the object.

In yet another aspect of the invention two or more images of the object are collected with locking pulses of different strengths and information about the relaxation is derived from the acquired images.

An advantage of the present invention is that it provides high tissue contrast and high signal-to-noise ratio in a short scanning time.

DETAILED DESCRIPTION OF THE PREFERRED EMBODIMENT

Figure 1:
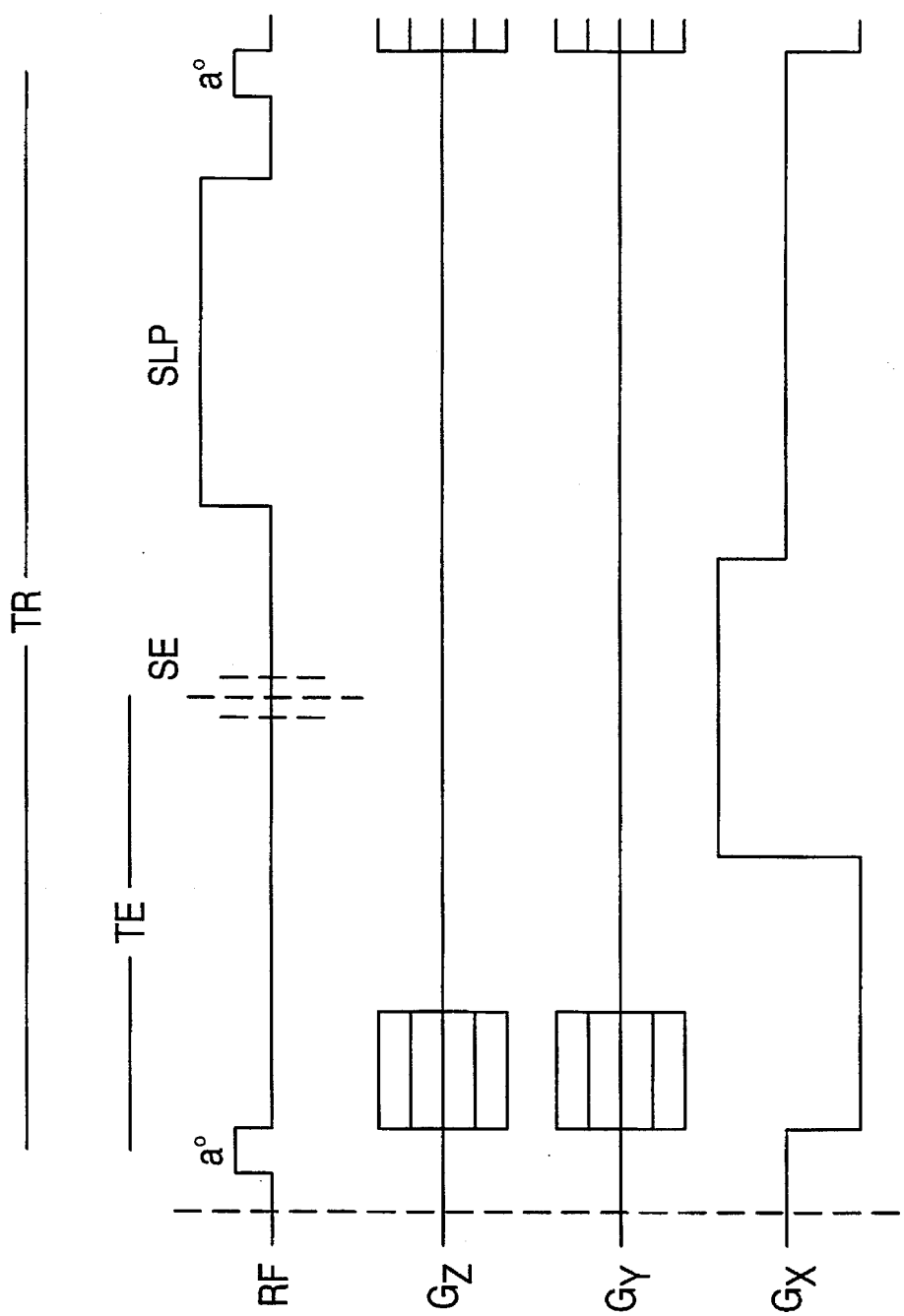
FIG. 1 shows an imaging sequence of the invention for three dimensional imaging of an object.

With reference to FIG. 1, a pulse sequence of an imaging sequence of the invention is illustrated. The pulse sequence of FIG. 1 is applied to an object disposed In a static magnetic field $B_o$.

R.F. excitation pulses, $a^o$ and SLP, which appear on the RF axis, are to be applied to the object and repeated with a repetition time TR. The excitation pulse $a^o$ is selected such that longitudinal nuclear magnetization Mz of protons in the object are decreased only a small amount. e.g. less than 45° (generally less than 90°). (Naturally, one may add multiples of 360° without changing the effective excitation angle.) The gradient pulses appearing on the $G_x$, $G_y$, $G_z$ axis are applied to the object between the excitation pulses $a^o$ and SLP. Due to the excitation and gradient pulses, protons in the object emit a spin-echo signal SE which is collected. The period between the excitation pulse $a^o$ and the spin-echo signal SE is the echo time TE. According to the Invention, an SLP pulse Is applied to the object before the excitation pulse $a^o$. The SLP pulse tilts the nuclear magnetization away from the direction of $B_o$, locks the magnetization with the rotating magnetic component and returns the magnetization back to the direction of $B_o$. The SLP pulse may contain an adiabatic half passage sweep in order to tilt the magnetization, a rotating magnetic component at the resonance frequency which locks the magnetization for a time period TL and an adiabatic half sweep which returns the magnetization back to the direction of $B_o$. The SLP pulse is a radio frequency electromagnetic pulse. $B_o$ used for clinical Imaging may be 0.01–4 T, the resonance frequency is In the radio frequency range, 0.4–200 MHz. This is why the SLP and excitation pulses are generally called radio frequency (RF) pulses.

During the application of the SLP pulse in FIG. 1 the magnetization of macromolecular protons $H_r$ in tissues will be saturated and the magnetization of protons having mobile and free molecules $H_f$ relaxes due to the enhanced magnetization transfer and motion of macromolecules. Because the relaxation due to macromolecules is more effective under the locking conditions than in the many orders of magnitudes stronger $B_o$ field, a high contrast between tissues is generated between tissues with different macromolecular structures. The contrast is further enhanced by the MT which takes place after the SLP pulse, because the recovery of $H_r$ is relatively slow. The excitation angle of the RF pulses related to the imaging procedure is low. Due to this, the longitudinal magnetization is not markedly changed by the excitation pulses and the signal collection may be effected with a short TR. In this way the scanning time is reduced but in spite of this the signal-to-noise ratio is good.

The resulting good contrast is based on the following phenomena: Under the locking conditions the magnetization relaxes towards the equilibrium value which corresponds to the strength of the locking field. Because the strength of the locking field is 0.001–0.01 times $B_o$ the equilibrium value is practically zero. The relaxation is characterized by the relaxation time T1rho. The relaxation under the locking conditions is due to two main mechanisms: Firstly, the slow thermal motion of macromolecules generates oscillating electromagnetic fields at the resonance frequency corresponding to the strength of the locking field. This stimulates the relaxation process. The efficiency of this resonance mechanism increases as the strength of the magnetic field decreases and because of this the magnetization relaxes fast in tissues with a high content of macromolecules (mainly protein molecules). Secondly, the strength of the locking field corresponds to local fields generated by nuclei. This leads to a leakage of magnetization from $H_f$ to $H_r$ (magnetization transfer).

Due to the mechanisms described above, the magnetizations of tissues with a large amount of macromolecules and with a good macromolecule/water interaction (e.g. muscle, liver, brain tissues) decrease quickly towards zero. In contrast, the relaxation is slow in tissues having a low content of macromolecules or with weak macromolecule/water interaction.

According to the invention, the relaxed magnetization is returned back to the direction of $B_o$. As mentioned before, during the locking pulse $H_r$ will be saturated and therefore MT continues after the locking pulse. The magnetization of the tissues with a high macromolecular content decreases further contrary to the magnetization of tissues with a small macromolecular content.

Because the sequence may be repeated with a short TR (TR shorter than T1 of tissues in the imaging volume), the effect on the contrast by the successive locking pulses is cumulative. The cumulative contrast reaches a steady state which corresponds to the properties of tissues and the sequence parameters. By selecting a small flip angle (e.g. 2–20°) those tissues with a low macromolecular content will have a higher signal intensity than tissues with a high macromolecular content.

Figure 2:
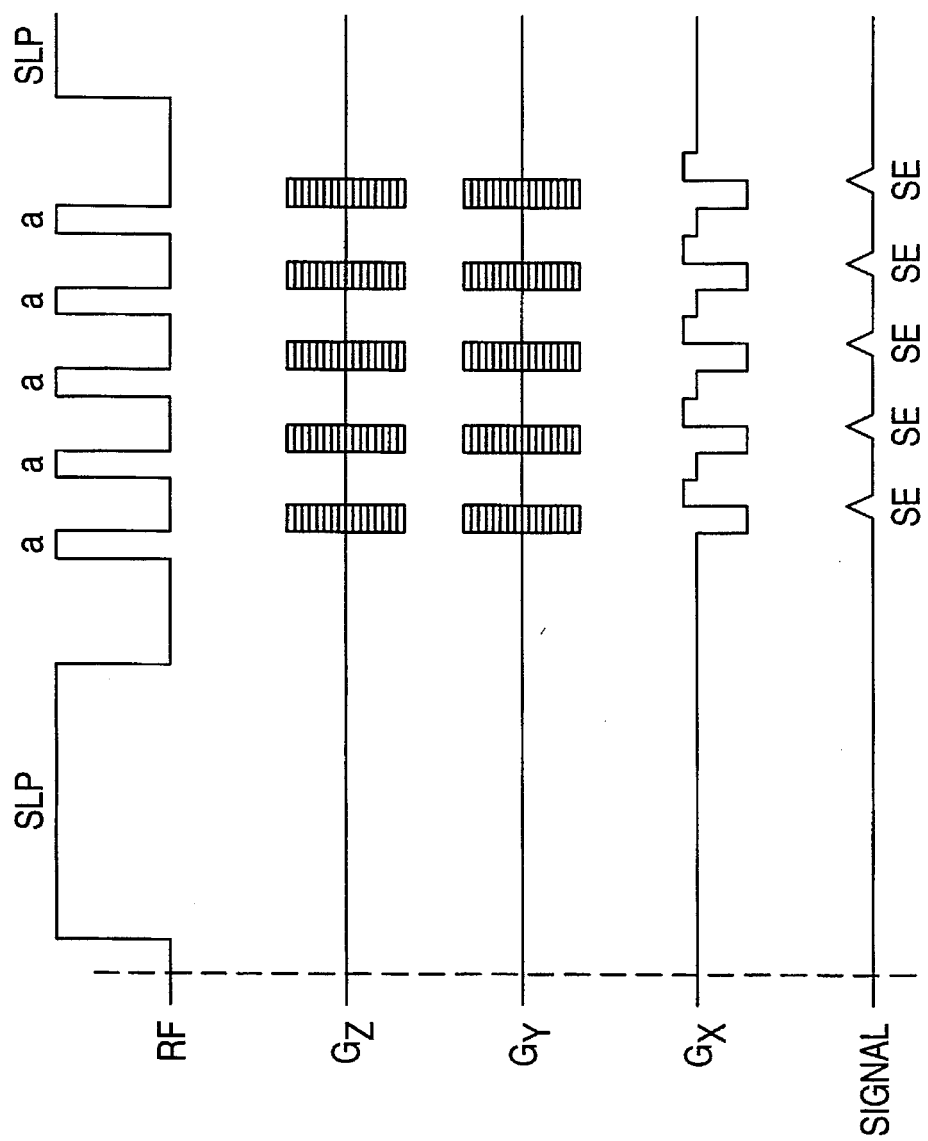
FIG. 2 shows an another imaging sequence of the invention for imaging of an object.

With reference to FIG. 2, another pulse sequence of the present invention is illustrated. In FIG. 2, after the SLP pulse, the signal is collected in the presence of several excitation pulses. In this sequence, the excitation angle is small, e.g. less than 45 degrees. The SLP pulse and the excitation sequence is to be repeated as many times as is needed by the imaging technique and the required signal-to-noise ratio.

Suitable methods for imaging of blood flow is described in "Physical principles and application of MR angiography", by Siebert, Pernicore and Potchen, Seminars in Ultrasound, CT, and MRI, Vol. 13, No., 1992, pp. 227–245. One of the most popular methods is the TOF (Time-Of-Flight) method, in which by using a selective saturation technique the signal of the static tissues in the imaging volume is suppressed and only blood flowing in the imaging volume and which is not therefore saturated emit a strong signal. Normally one performs the saturation using a sequence with a short TR compared to T1 of tissues in the imaging volume. Additionally one may utilize inversion pulses and magnetization transfer techniques. A method of the invention may be used also with the TOF methods in order to suppress the signals from static tissues. The advantages of the method of the invention are the simple application and the improved saturation capability compared to the known methods. It is common to the known TOF methods that the thickness of the slab to be scanned must be adjusted by the assumed speed of the flowing blood; fresh blood must completely fill the vessels to be visualized in the slab during TR. The final image of the blood vessels is often generated by using Maximum Intensity Projection (MIP) technique. According to the invention it is also feasible to scan the object with a different locking period (TL) and a different value for the magnetic component of the radio frequency locking field (B1L) portion of the SLP pulse. From these scans it is possible to calculate difference or ratio images, some information from the water/macromolecule interaction. It is also feasible to differentiate the effects of paramagnetic and macromolecular relaxations in tissues.

The present Invention offers an improved technique for generation of contrast between tissues with different macromolecular structures. The optimization of the scanning parameters is determined as follows:

If the excitation angle is less than 20° the magnetization will not be affected by the excitation pulses and period between successive excitations TR may be short The contrast will be adjusted by using the length of the SLP pulse. The longer the SLP pulse the weaker signal will be emitted by tissues with a high macromolecular content and the better is the contrast between CSF and brain tissue.

The strength of the SLP pulse should be minimized. A suitable value could be 50 micro T ($50 \times 10^{-6}$)

Paramagnetic substances, such as Gd-DTPA, decrease relaxation times especially the relaxation time T1 will be shortened. In this case the best contrast will be generated by selecting a relatively large excitation angle and a relatively short SLP pulse, it may be beneficial to select a short TR.

Because tissues in which Gd-DTPA will be collected will have a T1 which is significantly different from T1 of other tissues, it is beneficial to emphasize this contrast parameter. This may be effected by inverting the magnetization after the locking pulse. In this case the magnetization experiences a complete adiabatic sweep and tilts 180°.

A special diagnostic problem in which the technique may be applied is the staging of breast cancer and evaluation of the possible spread of the tumor. Cancerous tissue is generally very heterogenous and often contains tissue components with a high water/macromolecule interaction. Tissue characteristic information may be obtained by collecting two images with the method of the invention and changing the effect of the interaction on the contrast by modifying the parameters of the SLP pulse. This information may be used to evaluate the spread of the tumor. For example, by subtraction of the two images a difference image may be generated, e.g. fatty tissues will have a weak signal on the difference image.

The method of the invention may be used for:

Screening for brain pathologies. The sequence is more effective than the known RARE and Spin Echo sequences.

MR angiography: The sequence provides a high water/tissue contrast, a short TE reduces the effect of turbulence.

Follow up of fatty infiltrations, the sequence provides a high fat/protein tissue contrast, the applications areas are e.g. liver, muscle and bone marrow diseases.

The sequence may be optimized for the detection of paramagnetic substances, because protein and paramagnetic relaxation may be differentiated.

The sequence provides with a high efficiency some information about relaxation processes. This may be effected by a generation of two or more Images with different parameters of the SLP pulse. One may change e.g. amplitude and/or the duration of the SLP pulse.

Just some of the possible embodiments of the Invention have been described in the above specification.

I claim:

1. A method for the magnetic resonance imaging examination of an object using one of the known magnetic resonance imaging techniques, said method comprising the steps of:

a. applying a radio frequency pulse to the object to tilt the nuclear magnetization from the direction of the polarizing magnetic field;

b. allowing the tilted nuclear magnetization in the object to relax along the magnetic component of the radio frequency pulse for a locking period;

c. orienting the nuclear magnetization parallel to the polarizing magnetic field; and d. applying a magnetic resonance imaging sequence to the object, said imaging sequence comprising:
    applying at least one excitation pulse to the object to generate transverse magnetization in the object such that after each of said at least one excitation pulse the angle between the nuclear magnetization and the polarizing magnetic field is less than 90°.

2. A method according to claim 1 wherein a spin echo is generated by performing the further steps of applying a first magnetic field gradient for a first period and applying a second gradient such that the second gradient has a component which is opposite to the direction of the first gradient.

3. A method according to claim 1 further including applying a refocusing pulse after each of said at least one excitation pulse to generate one or more spin echoes.

4. A method according to claim 1 wherein the magnetic resonance imaging method is Fourier imaging method.

5. A method according to claim 1 further including the introduction of a contrast agent into the object.

6. A method according to claim 1 wherein the radio frequency pulse comprises an adiabatic half passage sweep.

7. A method according to claim 1 wherein at least two excitation pulses following the locking period, said excitation pulses generating a transverse magnetization such that the angle between the nuclear magnetization and the direction of the polarizing magnetic field is less than 90°.

8. A method according to claim 1 wherein at least two spatially selective excitation pulses are applied on different parts of the object in a predetermined order.

9. A method according to claim 1 wherein the at least one excitation pulse is spatially selective and the width of the area to be excited is predetermined such that a moving material fills the predetermined proportion of the area to be excited during TR.

10. A method according to claim 9 wherein a map of blood vessels in the object under examination is formed by using a maximum intensity projection method.

11. A method according to claim 1 further including,
 generating two or more images of the object by repeating steps a through d with different locking periods and different strengths of radio frequency pulse; and deriving information about the relaxation from the acquired images.

12. A method according to claim 1 further including acquiring two or more images of the object by repeating steps a through d, and introducing a paramagnetic substance into the object between the acquisition of two images of a part of the object.

13. A method according to claim 1 further including, acquiring two or more images of the same part of the object with locking pulses of different strengths.

14. A method according to claim 13 further including, deriving information about the relaxation from the collected images.

* * * * *